United States Patent
Shrivastava et al.

(10) Patent No.: US 8,680,901 B2
(45) Date of Patent: Mar. 25, 2014

(54) POWER ON RESET GENERATION CIRCUITS IN INTEGRATED CIRCUITS

(75) Inventors: Aatmesh Shrivastava, Richardson, TX (US); Rajesh Yadav, Bangalore, IN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/567,611

(22) Filed: Aug. 6, 2012

(65) Prior Publication Data
US 2014/0035634 A1  Feb. 6, 2014

(51) Int. Cl.
*H03L 7/06* (2006.01)
(52) U.S. Cl.
USPC .......................................... 327/143; 327/198
(58) Field of Classification Search
None
See application file for complete search history.

(56) References Cited

U.S. PATENT DOCUMENTS

| | | | |
|---|---|---|---|
| 5,638,330 A * | 6/1997 | Confalonieri et al. ... | 365/189.09 |
| 7,417,475 B2 * | 8/2008 | Byeon et al. ............. | 327/143 |
| 8,519,755 B2 * | 8/2013 | Suzuki et al. ............. | 327/143 |
| 2004/0124894 A1 * | 7/2004 | Kang et al. ............... | 327/143 |
| 2005/0280450 A1 * | 12/2005 | Shin et al. ................ | 327/143 |
| 2008/0238500 A1 * | 10/2008 | Jung ......................... | 327/143 |
| 2011/0234268 A1 * | 9/2011 | Chi et al. .................. | 327/143 |

FOREIGN PATENT DOCUMENTS

JP  6-132799  *  6/1994

* cited by examiner

*Primary Examiner* — Tuan T Lam
(74) *Attorney, Agent, or Firm* — John R. Pessetto; W. James Brady; Frederick J. Telecky, Jr.

(57) ABSTRACT

Integrated Circuits (ICs) comprising circuits configured to generate a power on reset (POR) pulse are disclosed. An IC comprises a power supply sense circuit configured to generate a sense signal in response to a transition of a power supply signal from a first level to a second level, and a pulse generation circuit coupled with the power supply sense circuit. The pulse generation circuit is configured to generate a power on reset (POR) pulse of a threshold duration based on the sense signal. The IC further includes a reset generation circuit coupled with the pulse generation circuit to receive the POR pulse. The reset generation circuit is configured to generate a reset pulse based on the POR signal and of at least one control signal, where the reset pulse is configured to be utilized to perform a reset of one or more elements of the integrated circuit.

10 Claims, 7 Drawing Sheets

US 8,680,901 B2

POWER ON RESET GENERATION CIRCUITS IN INTEGRATED CIRCUITS

TECHNICAL FIELD

The present disclosure generally relates to circuits for generation of reset signals in System on Chips (SoCs).

BACKGROUND

A number of integrated circuits, such as SoCs, include a variety of electronic devices that are electrically (or electronically) interconnected (or communicatively associated or coupled with one another). Some examples of such devices include, but are not limited to, memory devices, flip-flops, latches, registers and counters, and these devices hold signals in the form of binary levels such as logic '0' and logic '1'. In order to operate in real world applications, an exemplary implementation provides that such devices are to be in a known state, such as, for example, in a logic '1' state or a logic '0' state.

In certain exemplary applications, a power on reset (POR) pulse is used to pre-set, or pre-reset, these devices (such as the memory devices, flip-flops, latches and registers and counters). The POR pulse is generated on-chip so as to reduce cost and achieve better performance as compared to the exemplary scenario where the POR pulse is generated external to the chip, as the POR generated on-chip tends to be free, or relatively free, from inter-module and inter-chip noise. It is noted, however, that reducing the area and complexity of on-chip circuits that are configured to generate the POR pulse may be challenging.

SUMMARY

A number of exemplary Integrated Circuit (ICs), including circuits configured to generate a power on reset (POR) pulse, are disclosed. In an embodiment, an IC comprises a power supply sense circuit configured to generate a sense signal in response to a transition of a power supply signal from a first level to a second level. The IC also comprises a pulse generation circuit communicatively associated or coupled with the power supply sense circuit. The pulse generation circuit is configured to generate a power on reset (POR) pulse of a threshold duration based on the sense signal. The IC further includes a reset generation circuit communicatively associated or coupled with the pulse generation circuit. The reset generation circuit is configured to (1) receive the POR pulse and (2) generate a reset pulse based on the POR signal and of at least one control signal, wherein the reset pulse is configured to be utilized to perform a reset of one or more elements of the integrated circuit.

In some embodiments, a number of exemplary circuits configured to sense a power supply in a number of ICs are disclosed. In an embodiment, a circuit configured to sense the power supply comprises a voltage divider circuit comprising a first resistor and a second resistor coupled or positioned between a power supply and a reference supply. The voltage divider circuit is configured to generate a first signal proportional to the power supply signal at a node between the first resistor and the second resistor. The circuit also includes a Metal Oxide Semiconductor (MOS) transistor having first, second and third terminals, wherein the first terminal is communicatively associated or coupled with the node that is positioned to receive the first signal, the second terminal is communicatively associated or coupled with the power supply, and the third terminal is communicatively associated or coupled with the reference supply through a resistor. The MOS transistor is configured to assert or transmit a second signal at the third terminal upon, or in response to, the first signal being greater than a threshold voltage.

In one embodiment, the circuit configured to sense the power supply further comprises an inverter circuit comprising at least one PMOS transistor and at least one NMOS transistor coupled or positioned between the power supply and the reference supply. The inverter circuit is configured to (1) receive the second signal at gate terminals of the at least one PMOS transistor and the at least one NMOS transistor and (2) generate the sense signal at an output terminal of the inverter circuit in response to the second signal and the power supply signal. The sense signal follows (is substantially equal to) the power supply signal when the power supply signal ramps from the first level to a threshold level, wherein the threshold level is a level between the first level and the second level, and the sense signal transitions from the threshold level to the first level upon assertion or transmission of the second signal.

In some embodiments, a number of exemplary pulse generation circuits configured to generate a power on reset (POR) pulse in response to a sense signal (representing an "ON" state of a power supply in an IC) are disclosed. A pulse generation circuit comprises one or more delay blocks connected or coupled in a serial configuration such that the one or more delay blocks are positioned to generate the POR pulse. Each delay block comprises an inverter configured by a NMOS transistor and a PMOS transistor, wherein the inverter is configured to receive an input signal and provide an inverted input signal at an output terminal of the inverter. The delay block further comprises a MOS based resistor having a first node and a second node, wherein the first node is communicatively associated or coupled with the output of the inverter so as to be positioned to receive the inverted input signal and pass or transmit the inverted input signal to the second node. The delay block further comprises an amplifier circuit (e.g., a Miller amplifier) comprising an inverting voltage amplifier and a miller capacitor coupled or positioned between an input node and an output node of the inverting voltage amplifier, wherein the charging and discharging of an equivalent capacitor at the input node of the inverting voltage amplifier is configured to generate a pulse of a pre-determined width or duration at the output node of the amplifier.

In an embodiment, the delay block further comprises a Schmitt trigger buffer communicatively associated or coupled with the output node of the inverting voltage amplifier. The trigger buffer is configured to receive the pulse of pre-determined width or duration and provide a portion of the POR pulse at an output node of the Schmitt trigger buffer. The input signal received by the inverter is the sense signal for the first delay block of the serial configuration of the pulse generation circuit. Additionally, the input signal is the output of the trigger buffer of a preceding delay block, which is arranged or positioned in the serial configuration with the remaining delay blocks. The one or more delay blocks are configured to generate the POR pulse of the threshold duration.

DETAILED DESCRIPTION

Figure 1A:
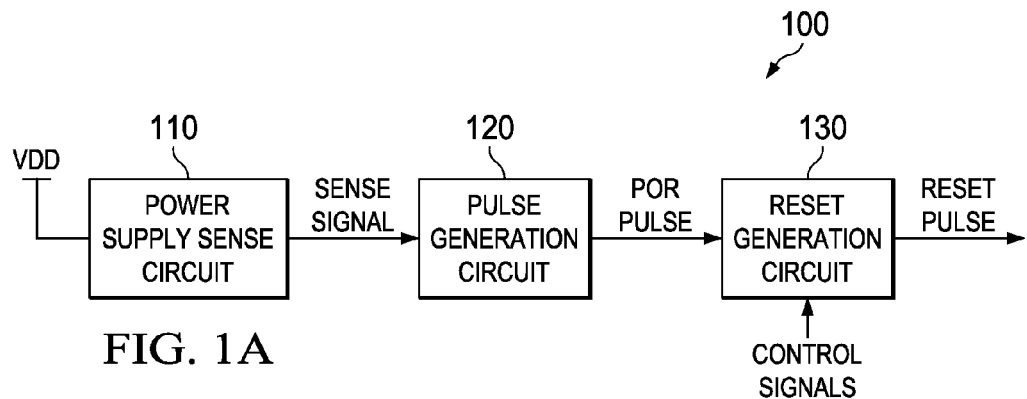
FIG. 1A is a block diagram of an exemplary integrated circuit (IC) configured to have a reset signal generated thereon in accordance with an embodiment.

Referring to FIG. 1A, a block diagram of a circuit configured to generate a reset signal based on a Power on Reset (POR) pulse in an Integrated Circuit (IC) 100 is shown, in accordance with an embodiment. The circuit 100 is configured to generate the POR pulse for a threshold duration that is utilized to pre-set, or pre-reset, a number of circuit elements, such as, for example, flip-flops, latches, registers, and other memory elements in the IC.

The circuit 100 includes a power supply sense circuit 110 and a pulse generation circuit 120 communicatively associated or coupled with the power supply sense circuit 110. In an embodiment, the power supply sense circuit 110 (hereinafter referred to as 'sense circuit 110') is configured to sense a status of a power supply signal (for example, Vdd supply) and generate a sense signal in response to the status of the power supply signal. For example, if the Vdd supply is turned "ON" or activated (or Vdd supply is asserted or transmitted) and starts transitioning from a first level to a second level (e.g., from '0' (low) level to '1' (high) level), the sense signal is also asserted or transmitted. In an embodiment, as the Vdd supply is turned "ON" or activated and starts transitioning from low to high, the sense signal also follows the Vdd supply and starts transitioning from the low level to the high level.

When the Vdd supply (e.g., during transitioning from low level to high level upon powering up) crosses a threshold level (for example, voltage 'V' as shown in waveform 150 of FIG. 1B), the sense signal transitions to low level from the voltage level 'V'. In an embodiment, as the sense signal transitions to the low level from the voltage level 'V', the pulse generation circuit 120 is configured to generate the POR pulse. In an embodiment, the POR pulse is a pulse having a duration of time 't', and, during the time 't', the circuit elements (not shown) of the IC 100 may be reset or set to a known state.

In an embodiment, the IC 100 also includes a reset generation circuit 130 configured to generate a reset pulse based on the POR pulse and at least one control signal so as to ensure that a proper POR pulse is generated in the IC 100. In an embodiment, the reset generation circuit 130 may generate the reset pulse (a proper POR pulse) based on a number of control signals, such as, for example, a power down signal (pwr_dwn) or a bypass signal (bypass). In some embodiments, the IC 130 may include a plurality of reset generation circuits 130 corresponding to a plurality of circuit blocks in the IC 100. In an embodiment, each reset generation circuit 130 may generate a reset pulse for its corresponding circuit block based on a local power sequencing in the circuit block.

Figure 2:
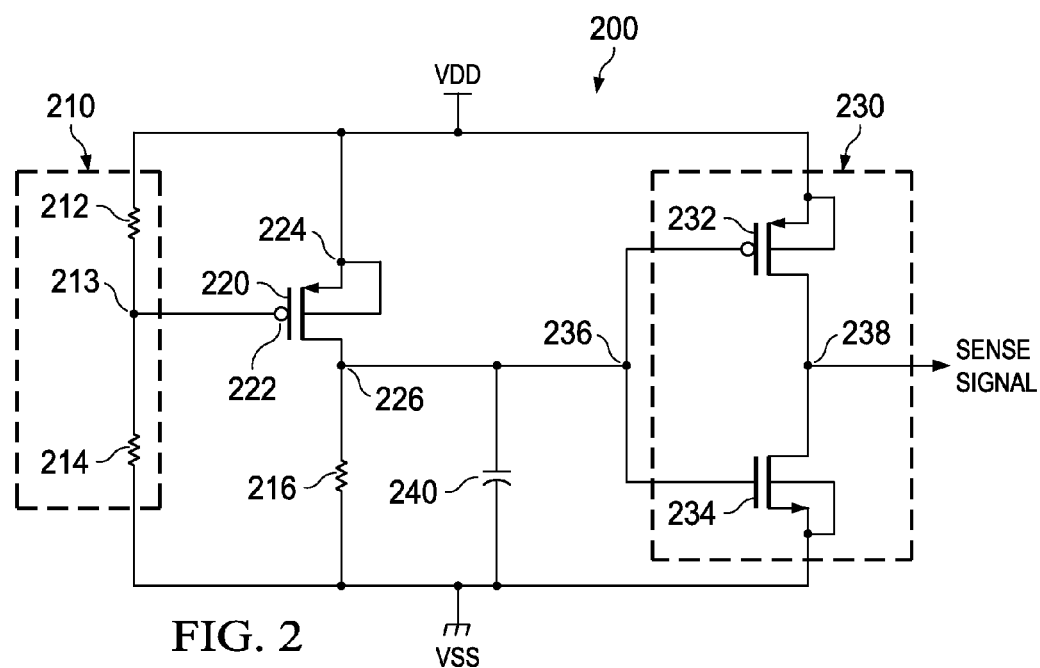
FIG. 2 is a circuit diagram of a first exemplary power supply sense circuit of an IC in accordance with an embodiment.

FIG. 2 represents an exemplary power supply sense circuit 200 according to an embodiment. The sense circuit 200 is configured to sense (e.g., detect) the power supply such as the Vdd supply (see, e.g., Vdd) and generate a sense signal (see, e.g., sense signal) if the Vdd supply is turned "ON" or activated. In an embodiment, the sense circuit 200 is configured to generate the sense signal if the Vdd supply transitions from a first level to a second level, such as, for example, from a low level to a high level.

In the embodiment shown in FIG. 2, the sense circuit 200 includes a voltage divider circuit 210, a MOS transistor 220 and an inverter circuit 230. The voltage divider circuit 210 is coupled or positioned between the Vdd supply and a reference supply (see, e.g., Vss). In an embodiment, the reference voltage may be at a ground level or a substrate voltage in an IC, such as the IC 100. The voltage divider circuit 210 includes a resistor 212 and a resistor 214. The resistors 212 and 214 are configured in a serial configuration between the Vdd supply and the Vss supply. In the embodiment shown in FIG. 2, the voltage divider circuit 210 is configured to generate a first signal proportional to the Vdd supply at a node (see, 213) between the resistor 212 and the resistor 214. For example, voltage at the node 213 that is between the resistors 212 and 214 is proportional to the Vdd supply. For instance, if 'R1' is the resistance of the resistor 212 and 'R2' is the resistance of the resistor 214, voltage at the node 213 is equal to R2*Vdd/(R1+R2).

The MOS transistor 220 is coupled or positioned between the Vdd supply and a resistor 216, as illustrated in FIG. 2. In this embodiment, the MOS transistor 220 is shown as a PMOS transistor having terminals 222, 224 and 226. In this embodiment, terminal 222 (for example, a gate terminal) of the transistor 220 is communicatively associated or coupled with the node 213 such that terminal 222 is positioned to receive the first signal (for example, the signal at the node 213). The terminal 224 (for example, the source terminal) is communicatively associated or coupled with the Vdd supply, and the terminal 226 (for example, the drain terminal) is communicatively associated or coupled with the reference supply (for example, the Vss supply) through the resistor 216. The terminal 226 is also communicatively associated or coupled with a capacitor 240, as illustrated in FIG. 2. The capacitor 240 is configured to hold the terminal 226 stable and also to control (e.g., slow down) the signal transition at the terminal 226 so as to reject noise emanating from sources such as Vdd supply and/or from coupling from adjacent signal paths. The transistor 220 is configured to generate a second signal at the terminal 226 in response to the first signal received at the terminal 222.

The sense circuit 200 also includes an inverter circuit 230 configured by at least one PMOS transistor (for example, PMOS transistor 232) and at least one NMOS transistor (for example, transistor 234). The inverter circuit 230 is coupled or positioned between the Vdd supply and the Vss supply. In the embodiment shown in FIG. 2, gate terminals (shown by a common terminal 236) of the transistor 232 and 234 are connected to or coupled with the terminal 226 of the MOS transistor 220 such that the gate terminals are positioned to receive the second signal. The inverter circuit 230 is configured to generate the sense signal at an output terminal 238 of the inverter circuit 230 in response to the second signal and the status of the Vdd supply.

Figure 1B:
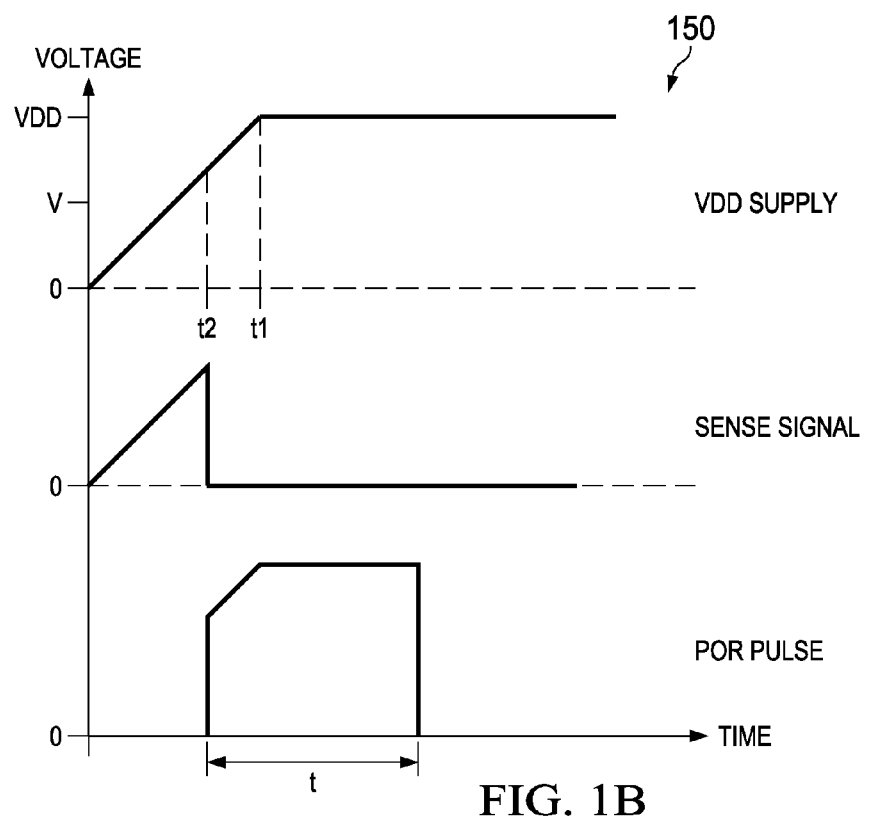
FIG. 1B is an exemplary waveform representation of signals of FIG. 1A.

In a representation, waveforms of the Vdd supply and the sense signal are also illustrated in FIG. 1B. Referring again to FIG. 1B, the Vdd supply (see, e.g., waveform 150) is shown as ramping from 0 volt (V) to a Direct Current (DC) level (for example, Vdd level). For example, between t=t0 and t=t1, the Vdd supply ramps from 0 V to a DC level such as 1 V. At t=t0, the Vdd supply is at the '0' level, and, accordingly, the voltage at the node 213 is at the '0' level. As the gate terminal 222 of the transistor 220 is connected to or coupled with the node 213, the transistor 220 remains in an "OFF" or dormant state. Furthermore, the node 226 (for example, the drain of the transistor 220) remains at a logic '0' level through the resistor 216. In this embodiment, if Vdd start rising towards 1 V from 0 V, voltage at the node 213 (for example, R2*Vdd/(R1+R2) also starts rising toward 1 V.

As the gate to source voltage (Vgs) of the transistor 220 is less than a threshold voltage of the transistor 220, the node 226 is at Vss voltage level. As the node 226 is at the Vss voltage level, the NMOS transistor 234 remains in an "OFF" or dormant state, and the PMOS transistor 232 acts as a low resistance connected to or coupled with the Vdd supply. As the transistor 234 remains in an "OFF" or dormant condition, the voltage at the node 238 (e.g., the sense signal) follows (for example, is substantially equal to) the voltage level of the Vdd supply signal through the PMOS transistor 232. As the gate to source voltage (Vgs) of the transistor 220 increases and crosses the threshold voltage of the transistor 220, the voltage level of the second signal generated at the node 226 increases towards the Vdd supply, thereby causing the NMOS transistor 234 to "turn ON" or to be activated. When, the transistor 234 "turns ON" or is activated, the voltage at the node 226 (e.g., the sense signal) achieves a low level. For instance, if at an instance t=t2, (where t2 is smaller than t1), the voltage at the node 213 (for example, R2*Vdd/(R1+R2) increases such that Vgs of the transistor 220 crosses the threshold voltage of the transistor 220, the second signal generated at the node 226 becomes greater than the threshold voltage of the NMOS transistor 232. As the NMOS transistor 234 "turns ON" or is activated, and as the PMOS transistor 232 "turns OFF" or is deactivated, the output signal of the inverter 230 (for example, the sense signal at the node 238) transitions to a 'low' level from a 'high' level.

It is noted that the level of the Vdd supply, at which the sense signal transitions to 'low' from 'high' is a VIH level of the sense circuit 200. The sense circuit 200 is also configured to transition the sense signal from the high level to the low level when the Vdd supply signal ramps down from a high level to a low level (for example, from the Vdd level to the 0 V level). It is noted that the level of the Vdd supply at which the sense signal transitions to 'low' from 'high' while the Vdd supply is ramping down from a high level to the low level is a VIL level of the sense circuit 200. Some embodiments of the present technology provide techniques for varying VIH and VIL voltage levels of the Vdd supply, at which the sense signal transitions (during which the Vdd ramps up from 0 V to the Vdd level, or ramps down from the Vdd level to 0 V, respectively).

Figure 3:
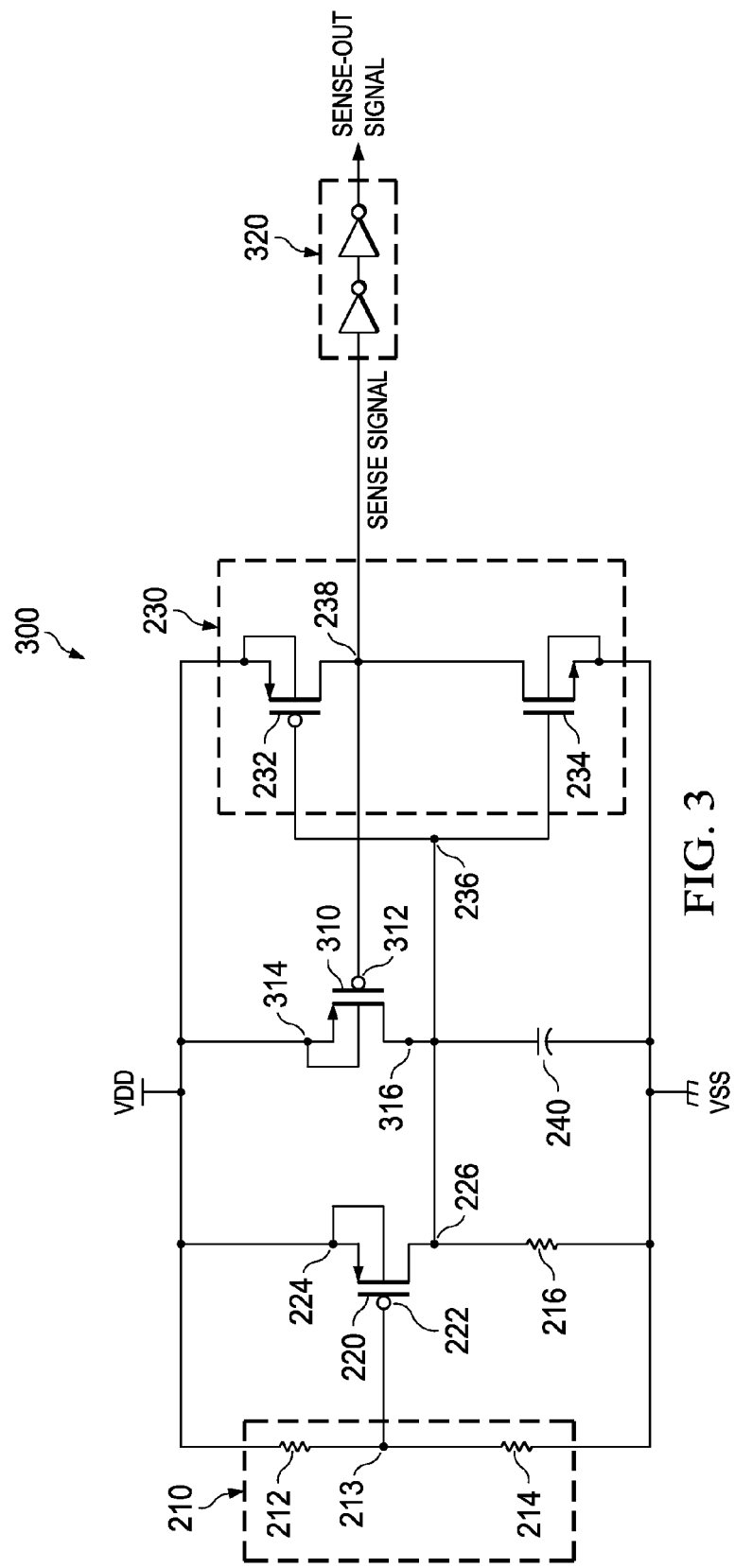
FIG. 3 is a circuit diagram of a second exemplary power supply sense circuit of an IC in accordance with an embodiment.

Referring now to FIG. 3, a power supply sense circuit 300 is shown in accordance with an embodiment. The sense circuit 300 includes components of the sense circuit 200 and a pull-up transistor 310. In the embodiment, the pull-up transistor 310 is shown as a PMOS transistor for exemplary purposes; it is noted, however, that the pull-up transistor 310 may include other configurations, such as a NMOS transistor and other Bipolar Junction Transistor (BJTs). A terminal 312 (for example, the gate of the transistor 310) of the transistor 310 is communicatively associated or coupled with the output terminal 238 of the inverter circuit 230 and is configured to receive the sense signal. A terminal 314 (for example, the source of the transistor 310) is communicatively associated or coupled with the Vdd supply, and a terminal 316 (for example, the drain of the transistor 310) is communicatively associated or coupled with the gate 236 of the inverter circuit 230 and the terminal 226 of the MOS transistor 220.

In an embodiment, the pull-up transistor 310 is configured to "pull-up" (for example, increase the voltage of) the second signal when the sense signal transitions to the low level from the high level. It is noted that the pull-up transistor 310 acts as a feedback for the inverter circuit 230 so as to provide a noise margin. For instance, once the output signal (e.g., the sense signal) transitions to a low state, the pull-up transistor 310 is turned "ON" or activated, and the second signal is pulled up (e.g., the voltage level of the second signal is increased). Accordingly, this changes the level of Vdd at which the sense signal will transition to a high level from the low level while the Vdd supply is ramping down from a high level to a low level. Accordingly, the rising and falling thresholds for the inverter circuit 230 will be different, thereby providing a considerable noise margin. In some embodiments, the sense signal may be provided to a buffer circuit configured to provide a buffered sense signal. In these embodiments, the sense circuit 300 includes one or more buffers 320 configured to provide a buffered sense signal (see, e.g., the 'sense_out' signal), and the 'sense_out' signal may be provided to the pulse generation circuit 120 in the IC 100.

It should be noted that some components of the sense circuits 200 or 300 are shown as including a particular type of MOS based transistor, such as a NMOS transistor and/or a PMOS transistor, for exemplary purposes; it is noted, however, that these components can be configured, for example, by MOS based transistors having different polarities, or by using Field Effect Transistors (FETs) or BJTs.

Figure 4:
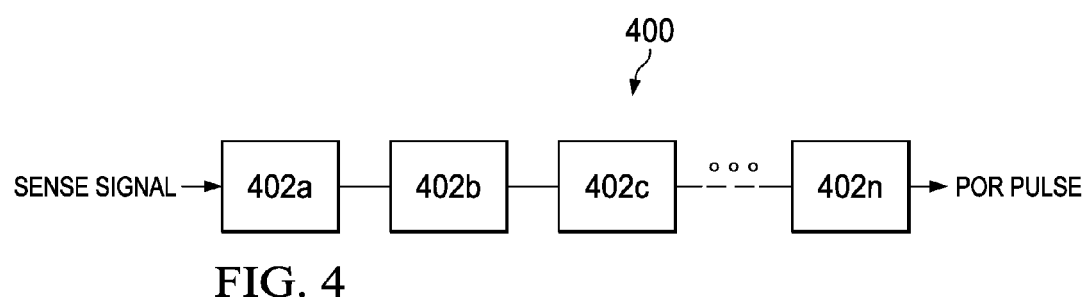
FIG. 4 is a block diagram of an exemplary pulse generation circuit of an IC in accordance with an embodiment.

Referring now to FIG. 4, a pulse generation circuit 400 is illustrated in accordance with an embodiment. The pulse generation circuit 400 includes one or more delay blocks (e.g., delay blocks 402a-402n) positioned to configure a power on reset (POR) pulse of a threshold duration from a sense signal received from a Vdd sense circuit, such as the circuits 200 or 300. In an embodiment, the delay blocks 402a-402n may be configured, arranged or positioned in a serial configuration to provide the POR pulse. In an embodiment, the POR pulse is of the threshold duration that is a period of sufficient duration in which the circuit elements (such as, for example, memory elements, latches, buffers, resistors, and the like) of the IC can be set or reset. It is noted that each of the delay blocks is configured to generate a POR pulse of a pre-determined delay and that the plurality of the delay blocks of the pulse generation circuit 400, in various combinations, generate a POR pulse that is of the threshold duration.

In an example, the pulse generation circuit 400 may be configured to generate the POR pulse for the threshold duration of 10 milliseconds (ms). For instance, if the pulse generation circuit 400 includes 'ten' delay blocks, each block may be configured to generate a delay of 1 ms, or all of the ten delay blocks in combination may be configured to generate a POR pulse of 10 ms. The first delay block (see, e.g., 402a) of the serial configuration of the pulse generation circuit 400 may receive the sense signal from the sense circuit and generate a pre-determined delay. It is noted that each delay block from among a plurality of the delay blocks (other that the first delay block in the serial combination) receives an output of the preceding delay block and generates its pre-determined delay, and the total or aggregated delay generated by all of the delay blocks from among the plurality of the delay blocks is equal to the threshold duration (for example, 10 ms). A delay block of the pulse generation circuit 400 is described further herein with reference to FIG. 5.

Figure 5:
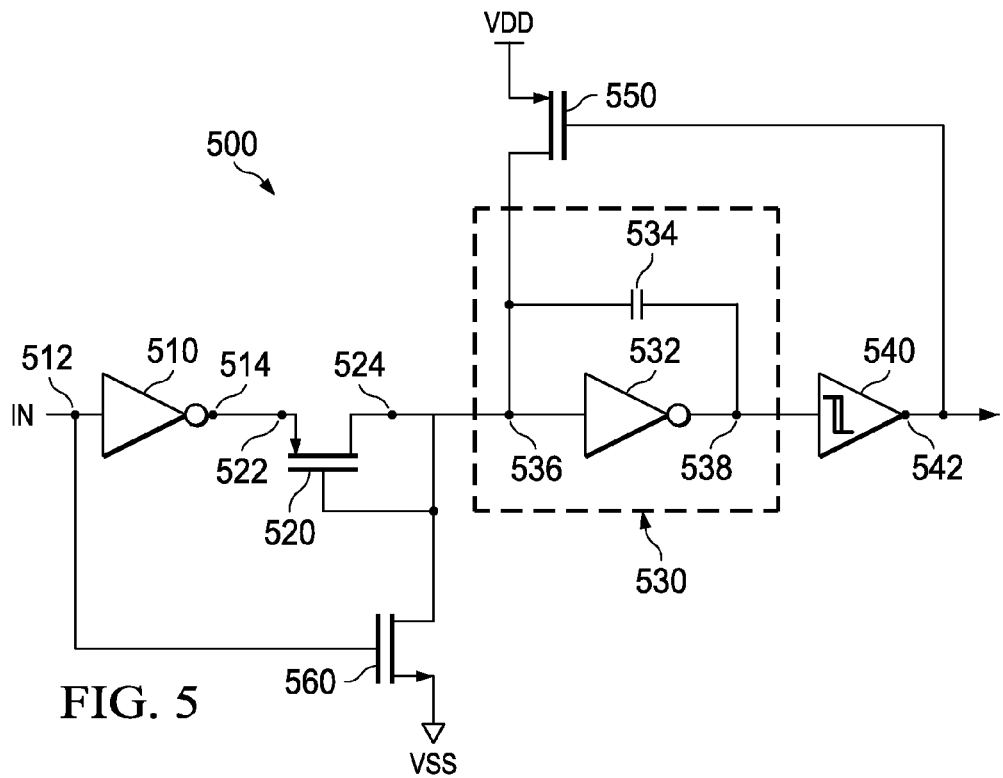
FIG. 5 is a circuit diagram of a first exemplary delay block of a pulse generation circuit in accordance with an embodiment.

Referring now to FIG. 5, a circuit diagram of a delay block 500 is shown in accordance with an embodiment. In an embodiment, the delay block 500 may be an example of the delay blocks 402a-402n. In this embodiment, the delay block 500 includes components that simulate at least one resistance (having equivalent resistance 'R') and at least one capacitance (having equivalent resistance 'C') so as to enable a charging and discharging of the capacitor C to thereby produce a delay corresponding to an RC time constant.

In the embodiment shown in FIG. 5, the delay block 500 includes an inverter 510, a MOS based resistor 520, an amplifier circuit 530, a Schmitt trigger buffer 540, a voltage pull-up circuit 550 and a voltage pull-down circuit 560.

In an embodiment, the inverter 510 is configured to receive an input (at input terminal 512) that may be an output of the previous delay block that is similar to the delay block 500. It is noted that, if the delay block is the first delay block of the pulse generation circuit 400, the inverter 510 is configured to receive the output of the power supply sense circuit (for example, the sense signal).

The MOS based resistor 520 is communicatively associated or coupled with the inverter 510 and receives an output of the inverter 510. For instance, a node 522 of the MOS based resistor 520 is communicatively associated or coupled with an output terminal 514 of the inverter 510. In this embodiment, the output of the inverter 510 (for example, an inverted sense signal) is provided to the MOS based resistor 520. The MOS based resistor 520 can be configured, for example, based on a PMOS or NMOS device used in a diode configuration. For instance, as shown in FIG. 5, the MOS based resistor 520 is shown as a PMOS device used in a diode configuration. The node 522 of the resistor 520 is communicatively associated or coupled with the output terminal 514 of the inverter 510, and a node 524 of the resistor 520 is communicatively associated or coupled with the amplifier circuit 530.

As illustrated in FIG. 5, the amplifier circuit 530 includes an inverting voltage amplifier 532 and a miller capacitor 534 coupled or positioned between an input node 536 and an output node 538 of the inverting voltage amplifier 532 such that the miller capacitor 534 is positioned to be implemented as a feedback capacitor. It is noted that, due to the Miller effect, an equivalent capacitance seen by a previous stage (for example, at the input node 536) is about (A+1)*C, where A is the gain of the inverting voltage amplifier 532 and C is the capacitance of the miller capacitor 534.

It is noted that the equivalent capacitor at the input node 536 (due to the miller effect) is charged through the inverter 510 and the resistor 520 and is discharged through the voltage pull-down circuit 560. In an embodiment, the discharging followed by the charging of the equivalent capacitor causes a pre-determined delay at the output node 538 of the inverting voltage amplifier 532. In this embodiment, the signal at the output node 538 of the inverter is a pulse of a pre-determined width or duration depending upon the equivalent capacitance (e.g., (A+1)*C) and an equivalent charging resistance (which may be equal to a net resistance of resistor 520 and the resistance of the charging path of the inverter 510). It is noted that due to the usage of the miller capacitor C in various embodiments of the present technology, the equivalent capacitance (A+1)*C is considerably large (that is dependent upon the gain 'A' of the amplifier 532). Accordingly, various embodiments of the present technology are capable of saving considerable area for configuring the equivalent capacitance from what would have been required in configuring a single capacitor of equal capacitance '(A+1)*C'.

Consider the example, where the delay block 500 is the first delay block of the pulse generation circuit, wherein the inverter 510 receives the sense signal from a sense circuit, such as the sense circuits 200 or 300. As the input of the inverter 510 (for example, the sense signal) transitions from 'high level' to 'low level', the inverter 510 provides an output that transitions from 'low level' to 'high level'. A 'high' output of the inverter 510 is passed from the MOS based resistor 520 at the input node 536 of the inverting voltage amplifier 532. As the 'high level' input is applied to the miller capacitor 534 at the input node 536, it charges the miller capacitor 534 (or the equivalent capacitor at the input node 536). It is noted that a charging path for the equivalent capacitor is enabled or provided through the MOS based resistor 520, and the charging time is dependent upon the R*Ceq time constant, where R is the equivalent resistance of the MOS base resistor 520 and the resistance of the charging path of the inverter circuit 510, and where Ceq is the capacitance of the equivalent capacitor ((A+1)C, where C is the miller capacitor 534 and A is the gain of the inverting voltage amplifier 532) at the input node 536 of the inverting voltage amplifier 532.

The delay block 500 also includes a Schmitt trigger buffer 540 and a voltage pull-up circuit 550. The buffer 540 is configured to provide a high noise margin to the output of the inverting voltage amplifier 532. In an embodiment, the output signal (from an output node 542) of the buffer 540 is a portion of the POR pulse generated by the delay block 500, and the output signal of the buffer 540 may be provided to the next delay block of the pulse generation circuit 400. As illustrated in FIG. 5, the voltage pull-up circuit 550 is coupled or positioned between the output node 542 of the buffer 540 and the input node 536 of the inverting voltage amplifier 532.

As shown in FIG. 5, the voltage pull-up circuit 550 is shown as a PMOS transistor. The pull-up circuit 550 is configured to pull-up or increase the voltage at the input node 536 upto the Vdd supply voltage. In an embodiment, there is a voltage drop equal to a threshold voltage (Vt) of the diode between the node 522 and the node 524 of the MOS based resistor 520. For instance, when a voltage Vdd is applied at the node 522 of the MOS based resistor 520, the maximum voltage of Vdd minus Vt (Vdd-Vt) is passed at the node 524. In an embodiment, in order to provide a full charging (up to the 'Vdd' voltage) of the equivalent capacitor at the input node 536 of the inverting voltage amplifier 532, the voltage pull-up circuit 550 causes the voltage at the input node 536 to pull-up upto the Vdd voltage level. Accordingly, the pull-up circuit 550 is configured to pull-up or increase the voltage at the node 536 until this voltage is equal to the full supply rail (e.g., the Vdd voltage), thereby reducing a short circuit current through the inverting voltage amplifier 532.

As illustrated in FIG. 5, the delay circuit 500 also includes the voltage pull-down circuit 560, which is coupled or positioned between the input terminal 512 of the inverter 510 and the input node 536 of the inverting voltage amplifier 532. In an embodiment, the pull-down circuit 560 enables the input node 536 to achieve a pre-determined state before charging the equivalent capacitor seen at the input node 536. For example, the pull-down circuit 560 is configured to pull-down or decrease the voltage at the input node 536 to a known state, such as at the Vss level. In the embodiment shown in FIG. 6, the pull-down circuit 560 is configured by a NMOS transistor;

however, the pull-down circuit 560 may be configured in a variety of other suitable ways, such as by using one or more PMOS transistors, one or more BJT transistors, or a combination thereof.

Figure 6:
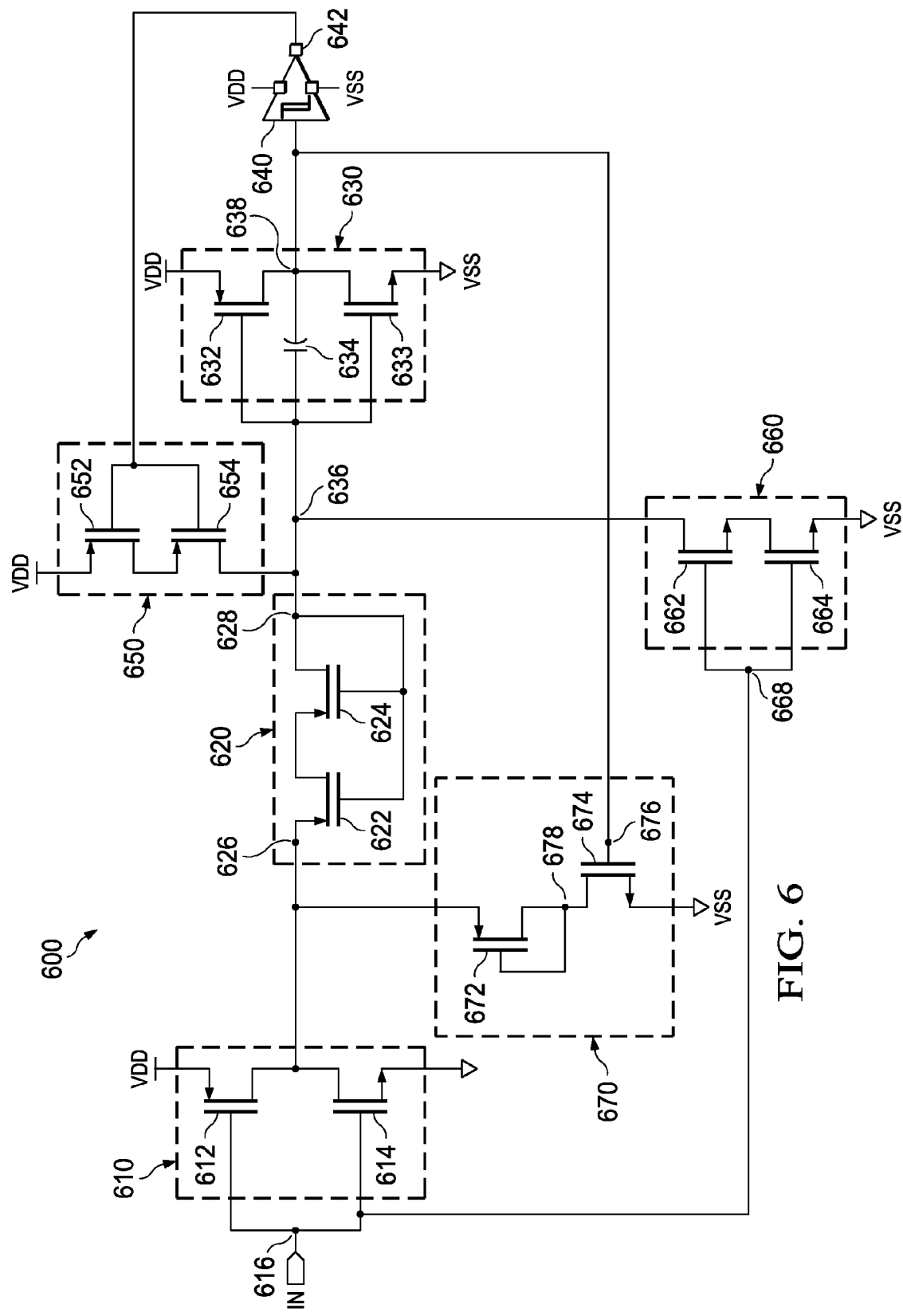
FIG. 6 is a circuit diagram of a second exemplary delay block of a pulse generation circuit in accordance with an embodiment.

Referring now to FIG. 6, a circuit diagram of a delay block 600 of a pulse generation circuit, such as the pulse generation circuit 400, according to an embodiment is shown. As illustrated in FIG. 6, the delay block 600 includes an inverter 610, a MOS based resistor, such as the MOS based resistor 620, an amplifier circuit 630, a Schmitt trigger buffer 640, a voltage pull-up circuit 650, a voltage pull-down circuit 660 and a MOS based load circuit 670.

In the embodiment shown in FIG. 6, the inverter 610 is configured by a NMOS transistor 612 and a PMOS transistor 614. Gate terminals (see, e.g., gate terminals 616) of the NMOS transistor 612 and the PMOS transistor 614 are configured to receive an input signal (see, e.g., IN). It is noted that if the delay block 600 is the first delay block of the pulse generation circuit, the sense signal (which is received from a sense circuit, such as the sense circuits 200 or 300) is input to the gate terminals 616 of the transistors 612 and 614. Alternatively, if the delay block 600 is a delay block other than the first delay block, the input received at the gate terminals 616 is the output of the previous delay block in the series combination of the pulse generation circuit.

As illustrated in FIG. 6, the output terminal of the inverter 610 is communicatively associated or coupled with a node 626 of the MOS based resistor 620. In this embodiment, the MOS based resistor 620 is shown as a series combination of two PMOS transistor based resistors 622 and 624. It is noted that two PMOS transistors are configured in diode configurations for exemplary purposes, and that other combinations of PMOS and/or NMOS components may also be used for configuring the MOS based resistor 620. The PMOS transistors 622 and 624 provide a resistive path for the charging of the equivalent capacitor at an input node 636 of the amplifier circuit 630.

A node 628 of the resistor 620 is communicatively associated or coupled with an input of the amplifier circuit 630. In this embodiment, the amplifier circuit 630 includes an inverting voltage amplifier configured by a PMOS transistor 632, a NMOS transistor 633 and a miller capacitor 634. The miller capacitor 634 is coupled in a feedback path between the input node 636 of the transistors 632 and 633 and an output node 638 of the transistors 632 and 633. The output node 638 of the inverting voltage amplifier (or the transistors 632 and 633) is fed to the Schmitt trigger buffer 640 to remove an effect of the noise signals on the output received from the inverting voltage amplifier. In an embodiment, discharging and charging of the equivalent capacitor causes a pulse of a pre-determined width or duration at the output node 638 of the inverting voltage amplifier (e.g., the transistor 632 and 633), and the buffer 640 is configured to remove effects of noise on the pulse of pre-determined width or duration and provide a portion of the POR pulse at an output node 642 of the buffer 640.

As illustrated in the FIG. 6, the output node 642 of the Schmitt trigger buffer 640 is communicatively associated or coupled with an input of the voltage pull-up circuit 650. In the embodiment shown in FIG. 6, the voltage pull-up circuit 650 includes PMOS transistors 652 and 654 coupled or connected between a power supply (e.g., Vdd) and the input node 636. The PMOS transistor 652 and 654 are configured to pull-up or increase the voltage at the input node 636 until this voltage is equal to Vdd, as the full Vdd voltage is not passed at the node 628 of the MOS based resistor 620 from the node 626 of the MOS based resistor 620.

The voltage pull-down circuit 660 includes NMOS transistors 662 and 664 connected to or coupled with the input node 636 and a reference voltage level (such as Vss or ground level). In an embodiment, gate terminals (see, e.g., gate terminals 668) of the transistors 662 and 664 are communicatively associated or coupled with the input (IN) of the delay block 600. The NMOS transistors 662 and 664 are configured to pull-down or decrease the voltage at the input node 636 to a pre-determined state (such as at the Vss level). The delay block 600 also includes the MOS based load circuit 670. In this embodiment, the MOS based loading circuit 670 includes a PMOS transistor 672 used as a resistor and a NMOS transistor 674. The NMOS transistor has a gate terminal (see, e.g., gate terminal 676) communicatively associated or coupled with the output 638 of the amplifier circuit 630, and a terminal 678 (for example, a drain terminal) is communicatively associated or coupled with the node 626 of the MOS based resistor 620 via or through the PMOS transistor 672. The loading circuit 670 is configured to provide additional loading at the node 626 of the MOS based resistor 620. The loading circuit 670 is configured to reduce the gate to source voltage for the diode configuration of the MOS based resistor 620, thereby making the equivalent R to further increase and resulting into a higher RC delay.

Figure 7:
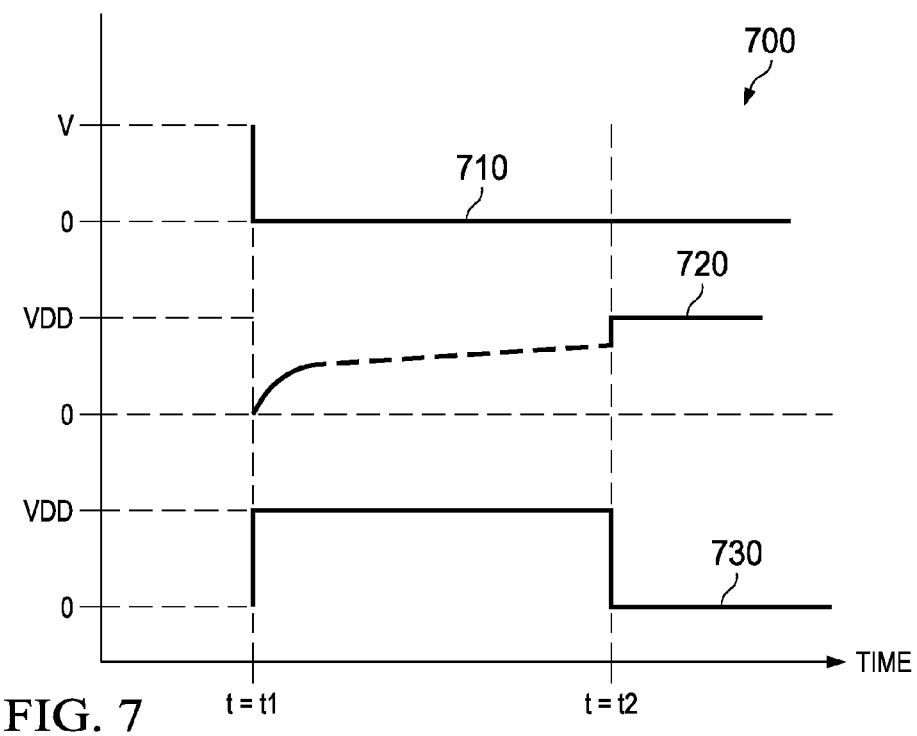
FIG. 7 is a timing waveform of the first and second exemplary delay blocks in accordance with an embodiment.

It is noted that each of the delay blocks from among a plurality of delay blocks, such as the delay block 500 or 600, provide a pulse of pre-determined width or duration by charging and discharging of the equivalent capacitors at the input nodes (536 and 636) of the amplifier circuits (530 or 630). Various embodiments provide delay blocks, such as the delay blocks 500 or 600 that provide faster rise time for the charging of the equivalent capacitors and relatively delayed fall paths for discharging of the equivalent capacitors. Accordingly, a delayed fall path may ensure that a sufficient delay is generated by each delay block from among a plurality of delay blocks. Referring now to FIG. 7, a plot 700 illustrating timing waveforms of delay blocks 500 or 600, is shown, in accordance with an embodiment.

As shown in FIG. 7, at t=t1, the input signal (IN) of the inverter 610, such as, for example, the sense signal, transitions to the low level from a high level (see, e.g., plot 710). As 'IN' transitions to the low level, the output of the inverter 610 transitions to the high level from an initial low level and is fed to the input node 636 of the amplifier circuit 630 via or through the resistor 620. As shown in plot 720, between time instances 't1' and 't2', the signal level at the input node 636 increases. For instance, due to the charging of the equivalent capacitor of the amplifier circuit 630, the voltage at the input node 636 starts charging up to Vdd-Vt. As shown in plot 730, during this period, the output node 642 of the Schmitt trigger buffer 640 (see, e.g., Out) remains at a high level.

At instance t=t2, the equivalent capacitor at the input node 636 of the amplifier circuit 630 charges to a level at which the output node 638 of the amplifier circuit 630 transitions from a high to low level thereby causing the Schmitt trigger buffer 640 also to transition to a low level from the initial high level. As shown in plot 730, the output node 642 attains a low level, and a pulse of pre-determined width or duration (e.g., t1-t0) is generated. At this instance (t=t2), as the output node 642 of the Schmitt trigger buffer 640 transitions to a low level, it causes the voltage pull-up device 650 to pull-up or increase the voltage of the node 636 to the Vdd level. It is noted that a pulse of pre-determined delay (for example, equal to t1-t0) is generated by the delay circuit 600, and, accordingly, a suitable number of such delay blocks may be added in serial configurations so as to generate the POR pulse of the threshold width or duration.

Figure 8:
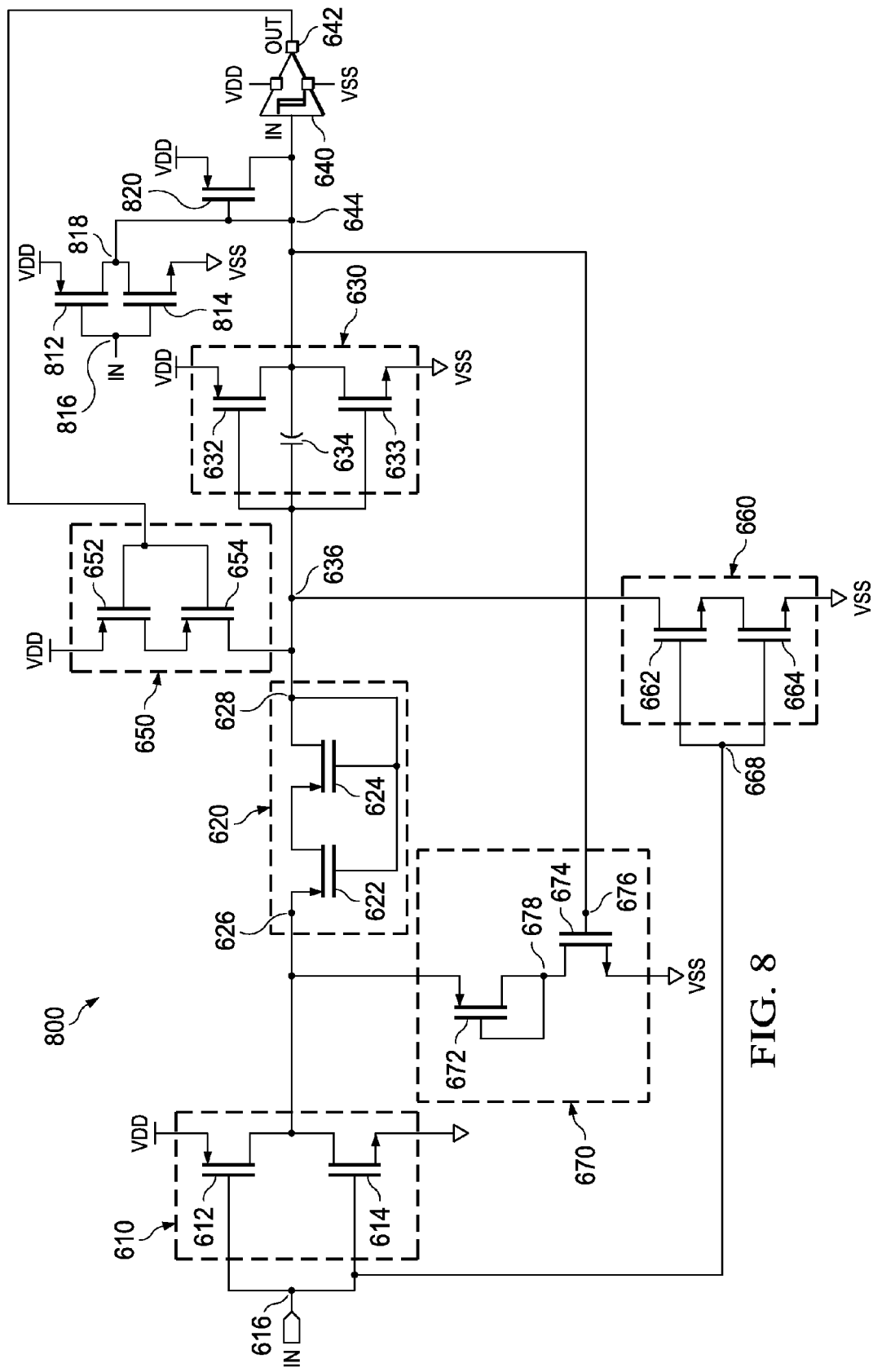
FIG. 8 is a circuit diagram of a third exemplary delay block of a pulse generation circuit in accordance with an embodiment.

Referring now to FIG. 8, a circuit diagram of a delay block 800 in accordance with an embodiment is shown. The delay block 800 includes a MOS based circuit communicatively associated or coupled with an input (see, e.g., an input node 644) of the Schmitt trigger buffer 640. In the embodiment shown in FIG. 8, the MOS based circuit includes an inverter circuit comprising a PMOS transistor 812 and a NMOS transistor 814, as well as a PMOS transistor 820 connected to or coupled with the input node 644 of the Schmitt trigger buffer 640. The input of the inverter circuit, such as, for example, gates (see, e.g., gates 816) of the transistors 812 and 814, are communicatively associated or coupled with the input of the delay block 800, and its output (see, e.g., output 818) is communicatively associated or coupled with a gate 822 of the PMOS transistor 820. The MOS based circuit is configured to provide the output node 642 (or input node 644) of the buffer 640 into knows states when, for example, the delay block 800 is activated. It should be noted that the pull-down circuit 660 and the MOS based circuit are configured to put pre-determined voltage levels at the nodes 636 and 644, respectively. In an embodiment, the nodes 636 and 644 can be put at the predetermined levels before the charging of the equivalent capacitor at the node 636. For instance, a high level at input (IN) can cause the node 636 to achieve a Vss level through the pull-down circuit 660, and the high level at input (IN) can cause the node 644 to achieve Vdd level through the inverter circuit (the PMOS transistor 820 and the NMOS transistor 814) and the PMOS transistor 820.

Accordingly, various embodiments provide sense circuits and pulse generation circuits configured to generate a POR pulse of sufficient durations in ICs. The POR pulse can be used to set or reset various circuit elements, such as memory, latches, buffers, registers, and the like, in the ICs. In various implementations, the POR signal is combined with some other control signals in order to generate a valid reset signal, while the control signals may depend upon the signals output from one or more power supplies. One exemplary implementation of the POR signal as a valid reset signal in an IC, according to an embodiment, is shown in FIG. 9.

Figure 9:
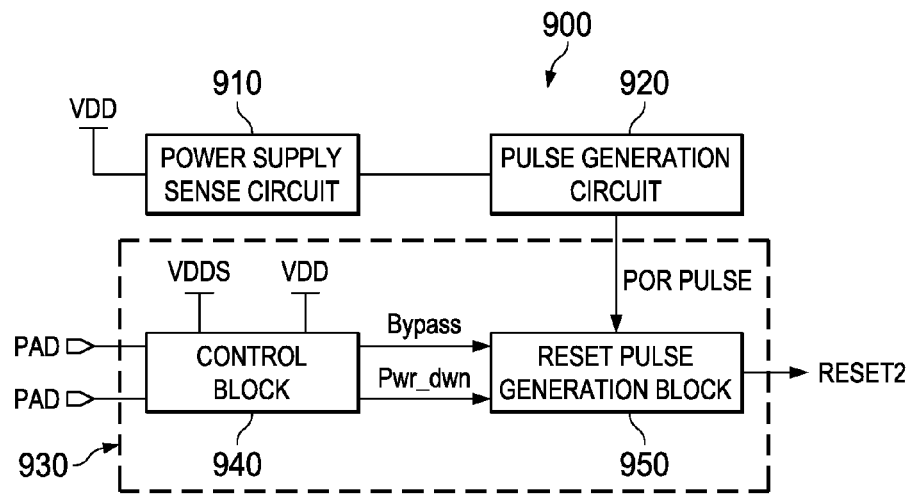
FIG. 9 is a block diagram representation of an exemplary generation of reset signal based on a POR pulse in an IC in accordance with an embodiment.

Referring now to FIG. 9, an implementation of a valid reset signal from the POR pulse in an IC 900 in accordance with an embodiment is shown. The POR pulse may be combined with at least one control signal in order to generate the reset pulse. In some scenarios, the POR pulse may be overridden by the at least one control signal to generate the reset pulse. As shown in FIG. 9, the IC 900 includes a power supply sense circuit 910 configured to generate a sense signal when the Vdd supply is powered up. The sense signal is used by a pulse generation circuit 920 to generate a POR pulse. In this embodiment, the IC 900 includes a reset generation circuit 930 that is configured to generate a reset pulse based on the POR pulse and at least one control signal. In an embodiment, the at least one control signal may be a power down signal (see, e.g., pwr_dwn) and a bypass signal (see, e.g., bypass).

In various instances, the pwr_dwn signal and the bypass signal may be associated with an Input Output (I/O) supply, such as, for example, Vdds and a global supply such as Vdd. In so much as the POR pulse is generated based on the status of the Vdd supply, and the I/O supply (e.g., Vdds) is not taken into account while the POR pulse is being generated, the reset generation circuit 930 is configured to provide a reset signal that is power sequencing independent of the Vdds supply. Accordingly, the reset generation circuit 930 includes a control block 940 and a reset pulse generation block 950 configured to generate the reset pulse that is power sequencing independent of the Vdds supply.

In this embodiment, the control block 940 is configured to generate the 'bypass' and 'pwr_dwn' signals based on a status of the power supply (for example, Vdd) and a power up sequence of the IO supply (for example, the Vdds supply). The control block 940 is configured to define a known state for the 'bypass' and 'pwr_dwn signals if the Vdds supply is absent (e.g., not powered up). For instance, a known state, such as '1' or '0', may be provided for the 'bypass' and 'pwr_dwn' signals to the reset pulse generation block 950 from the control block 940. Accordingly, using such known states of the 'pwr_dwn' and bypass signals, the reset signal (e.g., shown by 'resetz') will be generated based on the POR pulse. Accordingly, normal functionality of the POR (upon Vdd being powered up) can be enabled even in the absence of the Vdds supply. In such an implementation, once Vdds is powered up, bypass and pwr_dwn can either be defined for normal functionality, which will be same as the previous state, or bypass the POR pulse by using correct states of the 'bypass' and 'pwr_dwn' (received from the I/O pads (see, e.g., 'PAD')). Accordingly, a reset signal (resetz) is generated based on the POR pulse that is power sequencing independent of Vdds supply. In some embodiments, the control signals such as the bypass and pwr_dwn signals can override the POR pulse within the reset pulse generation block 950. For example, during normal operation, 'resetz' pulse will follow POR Pulse, but 'resetz' pulse can be set or reset using control signals (bypass or pwr_dwn) from the control block 940. A waveform representation of the power sequencing independent generation of the reset signal is shown in FIG. 10.

Figure 10:
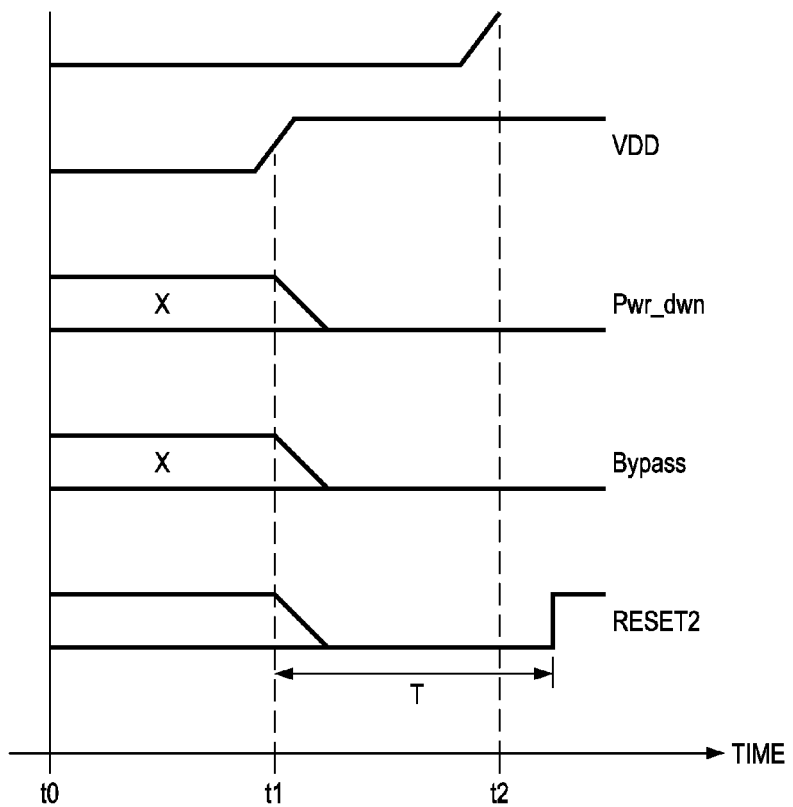
FIG. 10 is a timing diagram of an exemplary generation of a reset signal in the IC of FIG. 9, in accordance with an embodiment.

Referring now to FIG. 10, a timing diagram of the generation of the reset signal in the IC 900 in accordance with an embodiment is shown. As shown in FIG. 10, the Vdd supply ramps up at a time instant 't1' from low to high. At time instant 't0', both power supplied Vdds, Vdd are not powered up, and, accordingly, the 'pwr_dwn' and 'bypass' signals are not valid in the absence of the Vdds and Vdd signals, and the reset signal (e.g., the resetz pulse) is also not asserted or transmitted.

At this time instant 't1', the Vdd supply is powered up, whereas the Vdds supply is absent (e.g., not powered up). The control block 940 is configured to provide a known state, such as '0', for the 'bypass' and pwr_dwn signals, even in the absence of the Vdds supply, as long as the Vdd supply is ON. Accordingly, the reset signal of a duration T is generated based on the POR pulse. It is noted that the Vdds supply is powered up at an instant 't2', the 'bypass' and 'pwr_dwn' signals are already defined for normal functionality, which may be the same as the pre-determined state, or the POR pulse may be bypassed using the correct states of the 'bypass' and 'pwr_dwn' signals.

Without in any way limiting the scope, interpretation, or application of the claims appearing below, advantages of one or more of the exemplary embodiments disclosed herein is to provide ICs capable of generating on chip power on reset pulse that can be utilized to reset or set various circuit elements in the ICs. Embodiments of the present technology provide a POR pulse of varying pulse width or duration by having configurable delays in delay blocks. Various delay blocks used in the pulse generation circuit achieve reduced area requirements, due to the usage of Miller capacitors, and are capable of providing significant noise margins. Various embodiments also generate reset signals that are power sequencing independent of the power supplies, other than a main power supply, of the ICs.

It should be noted that reference throughout this specification to features, advantages, or similar language does not imply that all of the features and advantages should be, or are in, any single embodiment. Rather, language referring to the features and advantages is understood to mean that a specific feature, advantage, or characteristic described in connection with an embodiment is included in at least one embodiment of the present technology. Thus, discussions of the features and advantages, and similar language, throughout this specification may, but do not necessarily, refer to the same embodiment.

Various embodiments of the present disclosure, as discussed above, may be practiced with steps and/or operations in a different order, and/or with hardware elements in configurations which are different than those which are disclosed. Therefore, although the technology has been described based upon these exemplary embodiments, it is noted that certain modifications, variations, and alternative constructions are apparent and well within the spirit and scope of the technology. Although various exemplary embodiments of the present technology are described herein in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. An integrated circuit comprising:
a power supply sense circuit configured to generate a sense signal in response to a transition of a power supply signal from a first level to a second level;
a pulse generation circuit coupled with the power supply sense circuit, the pulse generation circuit configured to generate a power on reset (POR) pulse of a threshold duration based on the sense signal; and
a reset generation circuit coupled with the pulse generation circuit so as to be positioned to receive the POR pulse, the reset generation circuit configured to generate a reset pulse based on the POR pulse and at least one control signal, wherein the reset pulse is configured to be utilized to perform a reset of one or more elements of the integrated circuit;
wherein the pulse generation circuit comprises: one or more delay blocks connected in a serial configuration for generating the POR pulse of the threshold duration, each delay block comprising:
an inverter configured by a NMOS transistor and a PMOS transistor, the inverter configured to receive an input signal and provide an inverted input signal at an output terminal of the inverter;
a MOS based resistor having a first node and a second node, the first node coupled with the output terminal of the inverter to receive the inverted input signal, and pass the inverted input signal at the second node;
an amplifier circuit comprising an inverting voltage amplifier and a miller capacitor coupled between an input node and an output node of the inverting voltage amplifier, wherein discharging and charging of an equivalent capacitor at the input node of the inverting voltage amplifier is configured to generate a pulse of a pre-determined width at the output node of the inverting voltage amplifier; and
a Schmitt trigger buffer coupled with the output node of the inverting voltage amplifier, configured to receive the pulse of pre-determined width and provide a portion of the POR pulse at an output node of the Schmitt trigger buffer,
wherein the input signal received by the inverter is the sense signal for the first delay block of the serial configuration of pulse generation circuit and the input signal is an output of the Schmitt trigger buffer of a preceding delay block in the serial configuration for each of the remaining delay blocks of the serial configuration, and
wherein the one or more delay blocks are configured to generate the POR pulse of the threshold duration.

2. The integrated circuit of claim 1, further comprising:
a pull-up transistor having a first terminal, a second terminal and a third terminal, the first terminal coupled with the output terminal of the inverter circuit, the second terminal coupled with the power supply and the third terminal coupled with the third terminal of the MOS transistor and the gate terminals of the at least one PMOS transistor and the at least one NMOS transistor, the pull-up transistor configured to pull-up the second signal; and
a capacitor coupled between the third terminal of the MOS transistor and the reference supply, configured to control signal transition of the second signal.

3. The integrated circuit of claim 1, wherein the first resistor and the second resistor are MOS based resistors.

4. The integrated circuit of claim 1, further comprising one or more buffers coupled with the output terminal of the inverter circuit for providing a buffered sense signal.

5. The integrated circuit of claim 1,
wherein the power supply sense circuit comprises:
a voltage divider circuit comprising a first resistor and a second resistor coupled between a power supply and a reference supply, the voltage divider circuit configured to generate a first signal proportional to the power supply signal at a node between the first resistor and the second resistor;
a Metal Oxide Semiconductor (MOS) transistor having a first, second and third terminals, the first terminal coupled with the node for receiving the first signal, the second terminal coupled with the power supply, and the third terminal coupled with the reference supply through a resistor, the MOS transistor configured to assert a second signal at the third terminal in response to the first signal being greater than a threshold voltage; and
an inverter circuit comprising at least one PMOS transistor and at least one NMOS transistor coupled between the power supply and the reference supply, configured to receive the second signal at gate terminals of the at least one PMOS transistor and the at least one NMOS transistor and configured to generate the sense signal at an output terminal of the inverter circuit in response to the second signal and the power supply signal,
wherein the sense signal is substantially equal to the power supply signal when the power supply signal transitions from the first level to a threshold level, the threshold level being a level between the first level and the second level, and wherein the sense signal transitions from the threshold level to the first level upon assertion of the second signal.

6. The integrated circuit of claim 5, wherein the each delay block further comprises:
a voltage pull-up circuit coupled between the power supply signal VDD and the input node of the inverting voltage amplifier, the voltage pull-up circuit configured to pull-up a voltage at the input node to substantially equal to the power supply voltage for enabling the equivalent capacitor to charge to a voltage substantially equal to the power supply voltage.

7. The integrated circuit of claim 5, wherein the each delay block further comprises:

a voltage pull-down circuit coupled between the input node of the inverting voltage amplifier and the reference supply, configured to pull-down a voltage at the input node of the inverting voltage amplifier substantially equal to a reference supply voltage in response to the input signal that is received at the inverter.

8. The integrated circuit of claim 7, wherein the each delay block further comprises:

a MOS based circuit coupled with an input node of the Schmitt trigger buffer, the MOS based circuit configuring to provide a signal to the input node of the Schmitt trigger buffer to provide a pre-determined state at the output node of the Schmitt trigger buffer, in response to the input signal that is received at the inverter.

9. The integrated circuit of claim 7, wherein the MOS based resistor is configured in a diode configuration, and wherein the each delay block further comprises a loading circuit coupled with the first node of the MOS based resistor for increasing load at the first node of the MOS based resistor.

10. The integrated circuit of claim 1, wherein the reset generation circuit comprises:

a control block receiving the at least one control signal and configured to:
provide a pre-determined state signal at an output of the control block, when a local power supply is in OFF state and the power supply is in ON state, and
provide the at least one control signal at the output of the control block, when each of the local power supply and the power supply is in ON state; and a reset pulse generation block configured to generate the reset signal based on the output of the control block and the POR pulse received from the pulse generation circuit.

* * * * *